US006303433B1

(12) United States Patent
Kuo

(10) Patent No.: US 6,303,433 B1
(45) Date of Patent: Oct. 16, 2001

(54) METHOD OF FABRICATING NODE CONTACT

(75) Inventor: Chien-Li Kuo, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/340,972

(22) Filed: Jun. 28, 1999

(51) Int. Cl.[7] .............................................. H01L 21/8242
(52) U.S. Cl. ............................................ 438/254; 438/255
(58) Field of Search ................................... 438/253–256, 438/393–399

(56) References Cited

U.S. PATENT DOCUMENTS

| 5,851,878 | * | 12/1998 | Huang ................................. 438/255 |
| 5,888,865 | * | 3/1999 | Lin ..................................... 438/253 |
| 5,907,774 | * | 5/1999 | Wise ................................... 438/254 |
| 6,037,218 | * | 3/2000 | Dennison et al. .................. 438/254 |
| 6,080,621 | * | 6/2000 | Wang et al. ........................ 438/253 |

* cited by examiner

*Primary Examiner*—Jey Tsai
(74) *Attorney, Agent, or Firm*—Thomas, Kayden, Horstemeyer & Risley, LLP

(57) ABSTRACT

A method of fabricating a contact node. A first dielectric layer is formed on the substrate. A second dielectric layer and a third dielectric layer are formed in sequence over the substrate. A portion of the first dielectric layer, the second dielectric layer, and the third dielectric layer are etched to form a contact opening which exposes a portion of the substrate. A conductive layer is formed in the contact opening. The third dielectric layer is removed to exposes a portion of the conductive layer.

9 Claims, 3 Drawing Sheets

METHOD OF FABRICATING NODE CONTACT

BACKGROUND OF THE INVENTION

1. Field of the Invention

The present invention relates to a semiconductor fabricating method. More particularly, the present invention relates to a method of fabricating a capacitor.

2. Description of the Related Art

A memory function of a Dynamic Random Access Memory (DRAM) is carried out by controlling the voltage applied to the source region of a metal oxide semiconductor (MOS) transistor. Specifically, controlling the voltage applied to the MOS transistor entails controlling the flow of charges of a capacitor. In this manner, a read or a write operation is carried out, and thus the memory function of the DRAM is achieved. However, when the capacitor is operated, the charges in the capacitor are in a non-equilibrium state. In this non-equilibrium state, current leakage easily occurs. Therefore, it is necessary to refresh the capacitor periodically.

The refresh frequency depends on the charge-storage ability of the capacitor. As the storage ability of the capacitor increase, the refresh frequency for the capacitor is decreased. Thus, it would be advantageous to develop a capacitor having a high storage ability.

The storage ability of a capacitor can be increased by increasing the storage surface area of a capacitor or increasing the dielectric constant of a dielectric material. Since increasing the dielectric constant of the dielectric material usually involves material development, a long time is usually required for research and development. Thus, increasing the storage area of a capacitor by increasing the surface of bottom electrode is more expedient. The surface area of the bottom electrode can be increase by, for example, forming a hemispherical grained silicon (HSG) layer or increasing the height of the bottom electrode. In a fabrication process with a linewidth of 0.25 micrometers, or below, the surface area of a bottom electrode is increased not only by forming a HSG layer on the bottom electrode but also by increasing the height of the bottom electrode. However, the high bottom electrode often results in insufficient adhesion between the high bottom electrode and the contact node. This, in turn, causes the bottom electrode to lean or fall down. The quality of devices thus is degraded.

SUMMARY OF THE INVENTION

The invention provides a method of fabricating a contact node. A first dielectric layer is formed on the substrate. A second dielectric layer and a third dielectric layer are formed in sequence over the first dielectric layer. Portions of the first dielectric layer, the second dielectric layer, and the third dielectric layer are removed to form a contact opening which exposes a portion of the substrate. A conductive layer is formed in the contact opening. The third dielectric layer is removed to expose a portion of the conductive layer.

The invention also provides a capacitor of dynamic random access memory. A transistor is formed on a substrate. The transistor comprises a gate on the substrate and a source/drain region in the substrate. A first dielectric layer is formed on the substrate to cover the transistor. A second dielectric layer and a third dielectric layer are formed in sequence over the first dielectric layer. The first dielectric layer, the second dielectric layer, and the third dielectric layer are etched to form a contact opening which exposes a portion of the source/drain region. A conductive layer is formed in the contact opening and is electrically coupled with the source/drain region. A fourth dielectric layer is formed on the third dielectric layer and covers the conductive layer. Portions of the third dielectric layer and fourth dielectric layer are removed to form a storage node opening, which exposes a portion of the dielectric layer and a portion of the second dielectric layer. A bottom electrode is formed in the storage node opening to cover the exposed second dielectric layer and the conductive layer. The fourth dielectric layer and the third dielectric layer are removed to expose the second dielectric layer and the bottom electrode. A capacitor dielectric layer and a top electrode are formed in sequence to cover the bottom electrode.

In the present invention, the conductive layer serves as a node contact. After the third dielectric layer and the fourth dielectric layer are removed, the exposed conductive layer is used to provide support for the bottom electrode. The supported bottom electrode thus does not lean or fall down.

In comparison with the conventional method, in which only the top surface of the node contact is in contact with the bottom electrode, in the invention, the bottom electrode entirely covers the exposed conductive layer. Thus, the present invention increases the contact area between the node contact and the bottom electrode. Because of the increased contact area, the resistance between the node contact and the bottom electrode is decreased. The quality of the bottom electrode is enhanced. A high quality capacitor thus is obtained.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
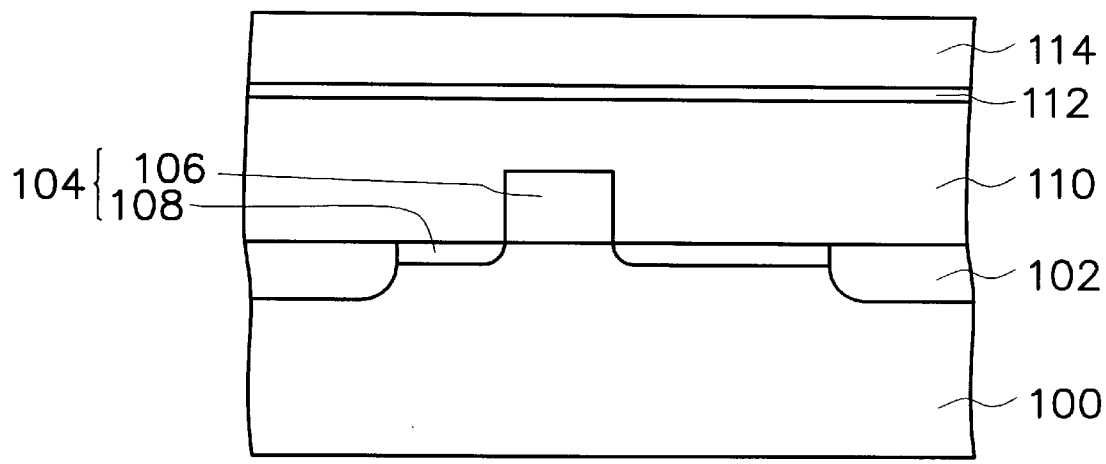
FIGS. 1A through 1F are schematic, cross-sectional views showing a method of fabricating a node contact according to one preferred embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

In FIG. 1A, an isolation region 102, such as a shallow trench isolation (STI) structure, is formed in a substrate 100. A metal oxide semiconductor (MOS) transistor 104 is formed on a substrate 100. The MOS transistor 104 comprises a gate 106 on the substrate 100 and a source/drain region 106 on opposite sides of the gate 106 in the substrate 100. A first dielectric layer 110 is formed on the substrate 100 to cover the MOS transistor 104. A second dielectric layer 112 is formed on the first dielectric layer 110. A third dielectric layer 114 is formed on the second dielectric layer 112. The material of the first dielectric layer 110 and the third dielectric layer 114 is preferably oxide. The third dielectric layer 114 is preferably about 300 angstroms to 500 angstroms thick. The material of the second dielectric layer 112 is preferably a nitride such as silicon nitride.

Figure 1B:
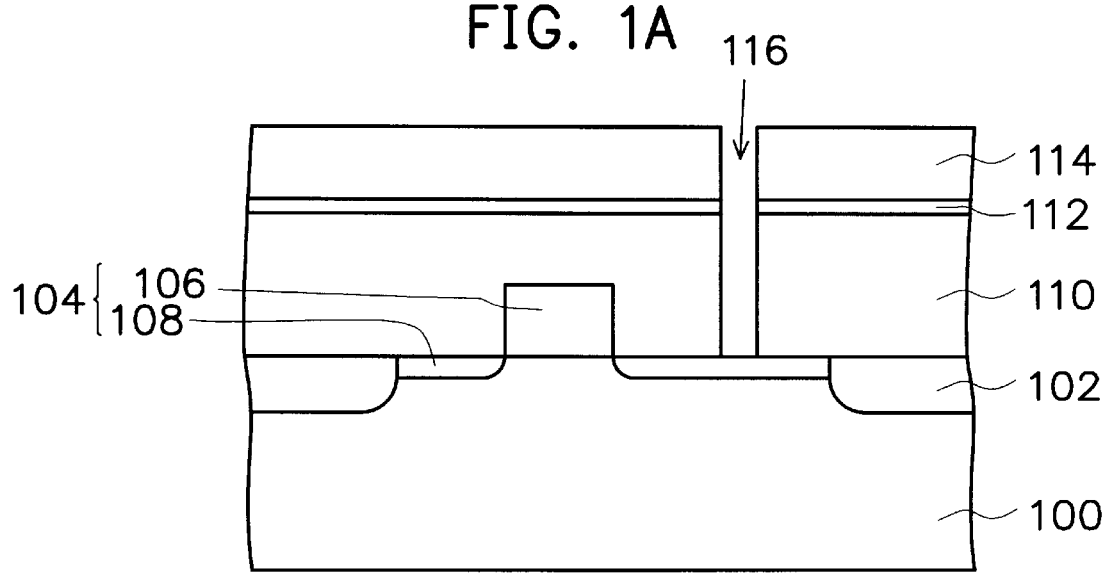

In FIG. 1B, an etching step, such as anisotropic etching, is performed. The first dielectric layer 110, the second dielectric layer 112, and the third dielectric layer 114 are etched. A contact opening 116 is formed in the first dielectric layer 110, the second dielectric layer 112, and the third dielectric layer 114. The contact opening 116 exposes a portion of the source/drain region 102 in the substrate 100.

Figure 1C:
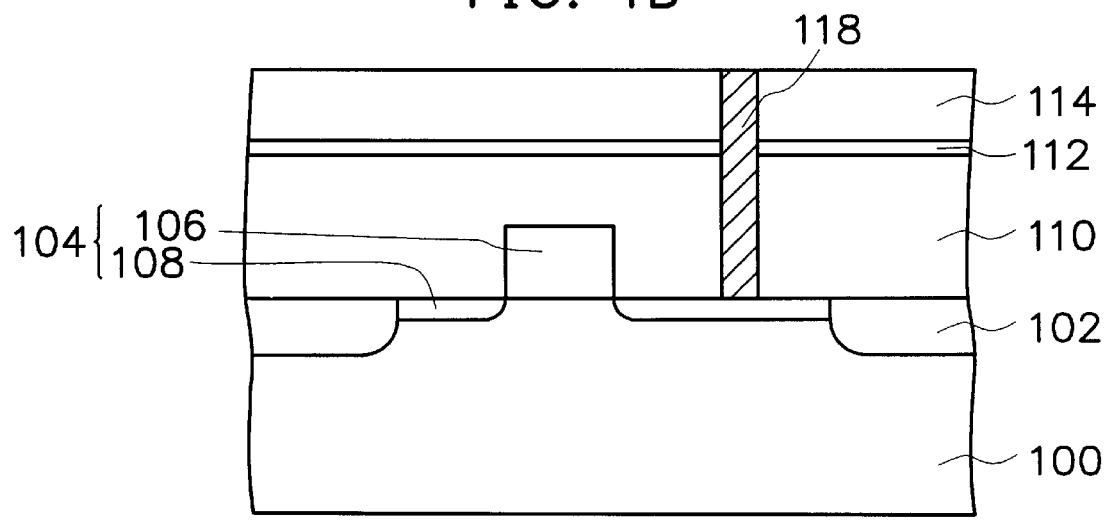

In FIG. 1C, a conductive layer 118 is formed in the contact opening 116. The conductive layer 118 is electrically coupled with the source/drain region 108. The conductive layer 118 serves as a node contact. The conductive layer 118 can be formed by the following exemplary steps. A conductive material (not shown) is formed to cover the third dielectric layer 114 and fills the contact opening 116. A planarization process is performed until the conductive material on the third dielectric layer 114 is removed, while the conductive layer 118 is left in the contact opening 116. The material of the conductive layer 118 comprises polysilicon.

Figure 1D:
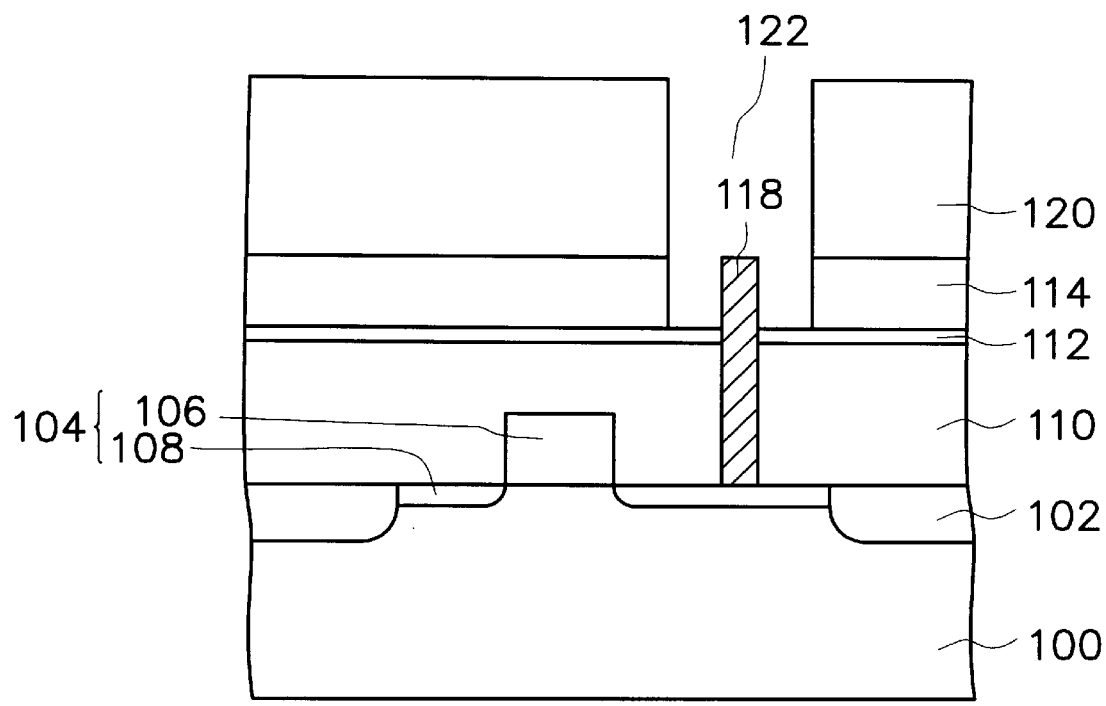

In FIG. 1D, a fourth dielectric layer 120 is formed over the substrate 100 to cover the third dielectric layer 114 and the conductive layer 118. The fourth dielectric layer 120 preferably comprises an oxide layer and has a thickness, which is the same as the height of a bottom electrode formed in the subsequent step. An etching step is performed to remove portions of the fourth dielectric layer 120 and the third dielectric layer 114 to from a storage node opening 122. The storage node opening 122 exposes a portion of the second dielectric layer 112 and a portion of the conductive layer 118. During the etching step, the second dielectric layer 112 is an etching stop layer. Since the etching rates for the second dielectric layer 112 and the conductive layer 118 are higher than the etching rates for the fourth dielectric layer 120 and the third dielectric layer 114. Thus, after the etching step, a portion of the second dielectric 112 and a portion of the conductive layer 118 are exposed.

Figure 1E:
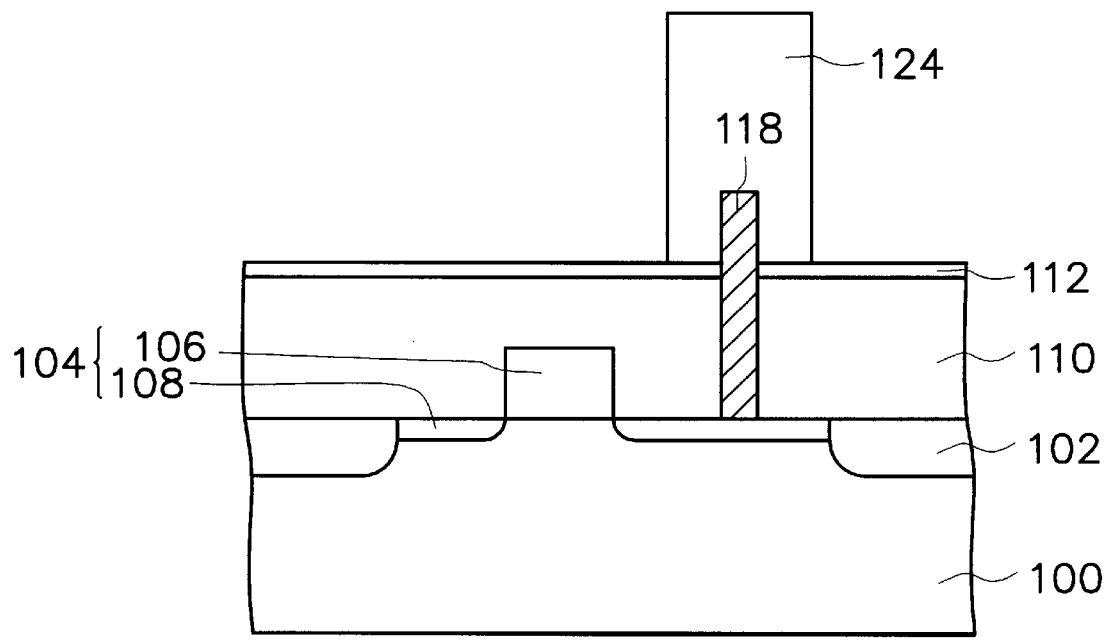

In FIG. 1E, a bottom electrode 124 is formed in the storage node opening 122. The bottom electrode 124 is electrically coupled with the substrate 100 through the conductive layer 118. The bottom electrode 124 can be formed by the following exemplary steps. A conductive layer (not shown) is formed over the substrate 100 to cover the fourth conductive layer 120 and fills the storage node opening 122. A chemical-mechanical polishing step is performed to remove a portion of the conductive layer until the fourth dielectric layer 120 is exposed. The bottom electrode 124 is formed in the storage node opening 122. The material of the bottom electrode 124 comprises polysilicon. The fourth dielectric layer 120 and the third dielectric layer 114 are removed to expose the second dielectric layer 112. The fourth dielectric layer 120 and the third dielectric layer 114 can be removed by, for example, etching.

Figure 1F:
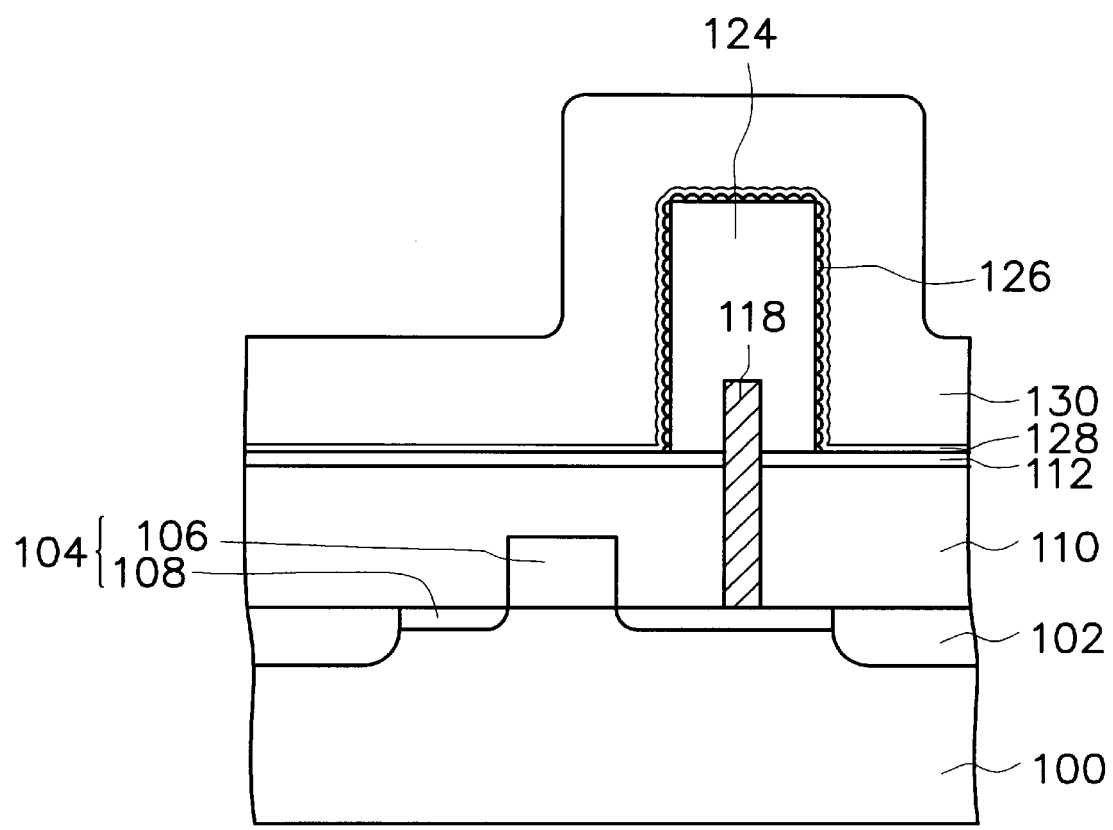

In FIG. 1F, in order to increase the surface area of the bottom electrode 124, a hemispherical grained silicon (HSG-Si) layer 126 is formed on the bottom electrode 124. The HSG layer 126 can be formed by first eroding the surface of the bottom electrode 124 with a HF solution, and then performing a thermal step to form the HSG layer 126 on the bottom electrode 124.

A capacitor dielectric layer 128 and a top electrode 130 of a capacitor are formed in sequence over the substrate 100 to complete a DRAM capacitor. The capacitor dielectric layer 128 comprises an oxide/nitride/oxide (ONO) layer and other suitable materials with a high dielectric constant. The material of the top electrode 130 comprises polysilicon.

In the present invention, the conductive layer 118 serves as a node contact. After a portion of the third dielectric layer 114 and a portion of the fourth dielectric layer 120 are removed, the exposed conductive layer 118 is ued to provide support for the bottom electrode 124. The supported bottom electrode 124 does not lean or fall down, as seen in the structure formed by the conventional method. In comparison with the conventional method, in which only the top surface of the node contact is in contact with the bottom electrode 124, in the invention, the bottom electrode 124 entirely covers the exposed conductive layer 118. That is, the bottom electrode 124 of the present invention is completely in contact with the exposed conductive layer 118. Thus, the present invention increases the contact area between the node contact and the bottom electrode 124. Because of the increased contact area, the resistance between the node contact and the bottom electrode 124 is decreased. The quality of the bottom electrode 124 is enhanced. A high quality capacitor thus is obtained.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor for a dynamic random access memory, comprising:

forming a transistor on a substrate, wherein the transistor comprises a gate on the substrate and a source/drain region in the substrate;

forming a first dielectric layer on the substrate to cover the transistor;

forming a second dielectric layer and a third dielectric layer over the first dielectric layer;

etching the first dielectric layer, the second dielectric layer, and the third dielectric layer to form a contact opening which exposes a portion of the source/drain region;

forming a conductive layer to completely fill the contact opening and electrically coupled with the source/drain region;

forming a fourth dielectric layer on the third dielectric layer to cover the conductive layer;

removing the third dielectric layer and the fourth dielectric layer to form a storage node opening, which exposes a portion of the second dielectric layer and a portion of the conductive layer;

forming a bottom electrode in the storage node opening to completely cover an exposed conductive layer and an exposed second dielectric layer;

removing the third dielectric layer and the fourth dielectric layer until the second dielectric layer is exposed; and forming a capacitor dielectric layer and a top electrode over the bottom electrode, wherein the exposed conductive layer provides support for the bottom electrode and is completely in contact with the bottom electrode.

2. The method of claim 1, wherein the second dielectric layer comprises a nitride layer.

3. The method of claim 1, wherein the third dielectric layer comprises an oxide layer.

4. The method of claim 1, wherein the third dielectric layer is about 300 angstroms to about 500 angstroms thick.

5. The method of claim 1, wherein the conductive layer comprises a polysilicon layer.

6. The method of claim 1, wherein the fourth dielectric layer comprises an oxide layer.

7. The method of claim 1, wherein the third dielectric layer and the fourth dielectric layer are removed by etching.

8. The method of claim 7, wherein etching rates for the third dielectric layer and the fourth dielectric layer are higher than etching rates for the second dielectric layer and the conductive layer.

9. The method of claim 1, wherein the top electrode comprises polysilicon.

* * * * *